(12) United States Patent
Franz et al.

(10) Patent No.: US 8,274,784 B2
(45) Date of Patent: Sep. 25, 2012

(54) ADJUSTABLE MULTI-ORIENTATION DISPLAY SUPPORT SYSTEM

(75) Inventors: Jason Franz, Austin, TX (US); Jason A. Shepherd, Austin, TX (US); Philip Seibert, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 220 days.

(21) Appl. No.: 12/785,914

(22) Filed: May 24, 2010

(65) Prior Publication Data

US 2011/0286171 A1    Nov. 24, 2011

(51) Int. Cl.
*G06F 1/16* (2006.01)

(52) U.S. Cl. .................. 361/679.21; 248/634; 348/836; 250/355.1

(58) Field of Classification Search ............... 248/125.9, 248/610, 317, 127, 634, 231.1, 157, 166; 348/14.01, 840, 836; 250/339.1, 339.08, 250/221, 385.1; 361/679.26, 679.01, 679.3, 361/679.4, 679.58, 679.06, 679.22, 679.21; 362/97.1, 362, 623, 97.2
See application file for complete search history.

(56) References Cited

U.S. PATENT DOCUMENTS

| | | | |
|---|---|---|---|
| 7,233,344 B2* | 6/2007 | Leichter | 348/14.01 |
| 7,566,033 B2* | 7/2009 | Schwager et al. | 248/125.9 |
| 2005/0236533 A1 | 10/2005 | McRight et al. | |

OTHER PUBLICATIONS

Mimo Monitors—Mimo 720-S, Mimo Monitors, 2009, 2 Pages, TBC Partners, LLC; http://www.mimomonitors.com/products/mimo-720-s.
Wacom Technology—Cintiq 12 WX, CintiQ® 12 WX: A Low Profile, Lightweight Cintiq, 2010, 3 Pages, Wacom, http:// www.wacom.com/cintiq-12wx.php.

* cited by examiner

*Primary Examiner* — Hung Duong
(74) *Attorney, Agent, or Firm* — Haynes and Boone, LLP (57) ABSTRACT

A display support system includes a chassis housing an electronic display and defining a support member channel. A support member is moveably coupled to the chassis. The support member is operable to move between a stored position in which the support member is positioned in the support member channel and a support position in which the support member extends from the chassis. An adjustment member is moveably coupled to the support member. With the chassis engaging a support surface, the adjustment member is operable to engage the support surface and move relative to the support member such that an angle between the electronic display and the support surface may be adjusted. The system allows the electronic display to be supported in either a landscape orientation and a portrait orientation, while allowing the angle between the support surface and the electronic display to be adjusted in either orientation.

18 Claims, 13 Drawing Sheets

ADJUSTABLE MULTI-ORIENTATION DISPLAY SUPPORT SYSTEM

BACKGROUND

The present disclosure relates generally to information handling systems, and more particularly to an adjustable multi-orientation display support system for an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs typically include displays for displaying information from the IHS to a user. In some situations, it may be desirable to use a mobile display with the IHS. For example, a user may wish to expand the number of displays available to a mobile IHS by coupling a mobile display to the mobile IHS for use in conjunction with the display that is native to the mobile IHS. The supporting of these mobile displays raises a number of issues. Conventional support systems for mobile displays typically add significant thickness to the mobile display, provide a support system that is separate from the mobile display, restrict the mobile display use to a single orientation, and/or restrict the support position of the mobile display to a single viewing angle. These issues reduce the mobility of the mobile display and restrict the available uses of the mobile display when the mobile display is being supported.

Accordingly, it would be desirable to provide an improved support system for a display.

SUMMARY

According to one embodiment, a display support system includes a chassis housing an electronic display and defining a support member channel, a support member moveably coupled to the chassis, wherein the support member is operable to move between a stored position in which the support member is positioned in the support member channel and a support position in which the support member extends from the chassis, and an adjustment member moveably coupled to the support member, wherein with the chassis engaging a support surface, the adjustment member is operable to engage the support surface and move relative to the support member such that an angle between the electronic display and the support surface may be adjusted.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
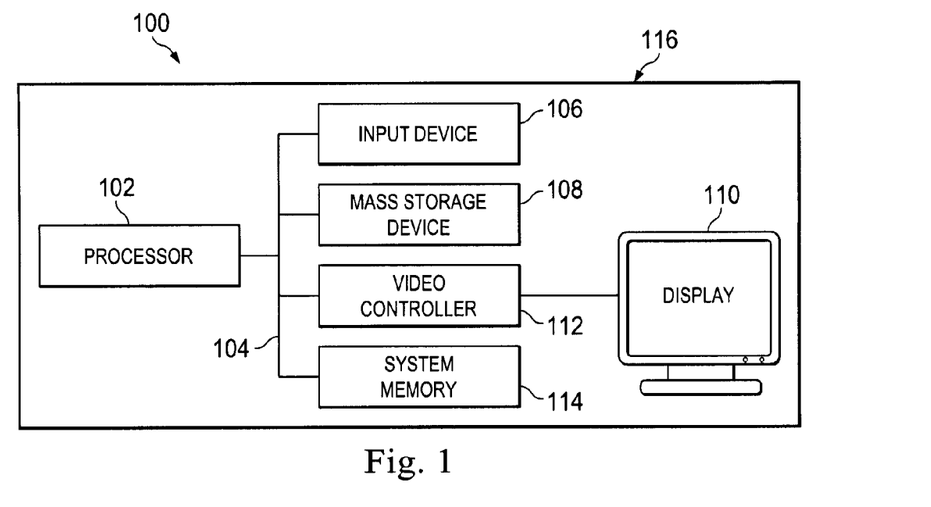
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
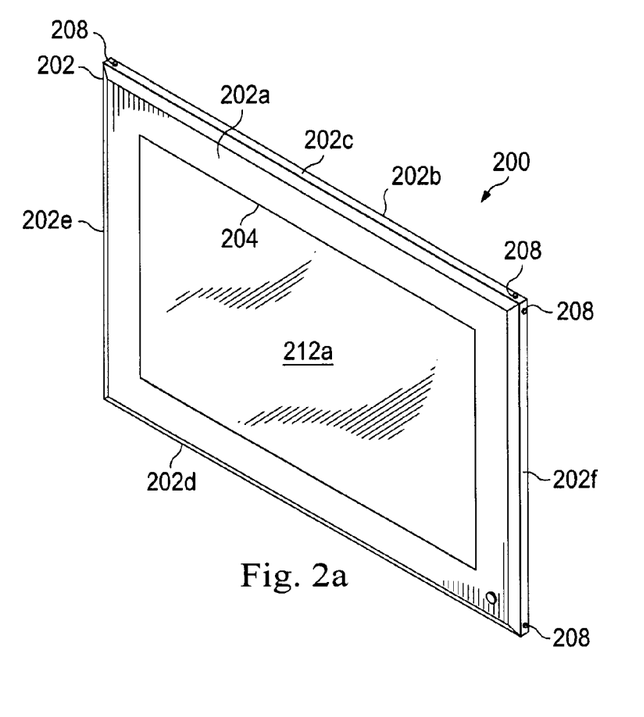
FIG. 2a is a front perspective view illustrating an embodiment of a display chassis.
Figure 2B:
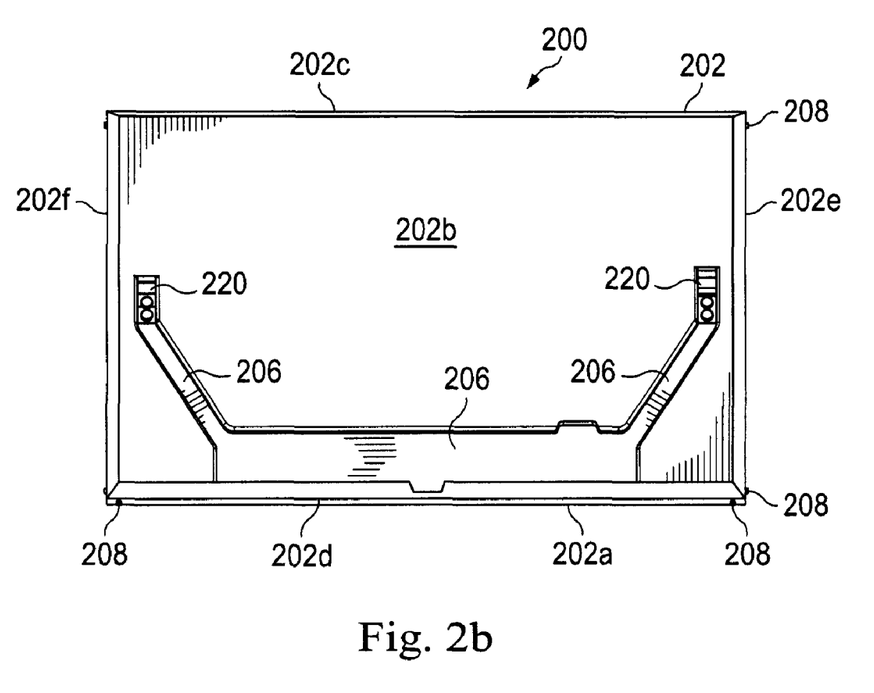
FIG. 2b is a rear perspective view illustrating an embodiment of the display chassis of FIG. 2b.
Figure 2C:
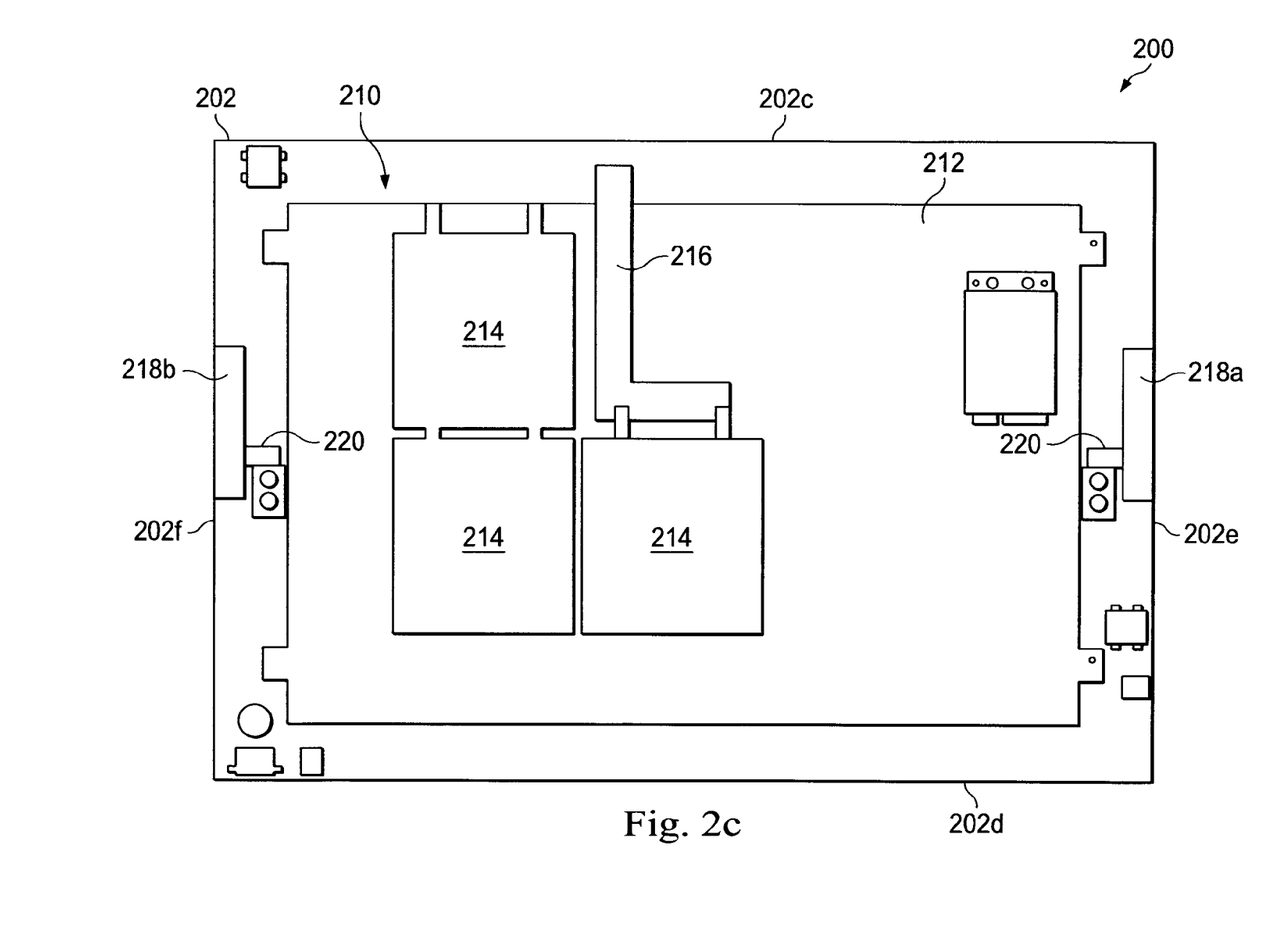
FIG. 2c is rear view illustrating an embodiment of a housing of the display chassis of FIGS. 2a and 2b.

Referring now to FIGS. 2a, 2b and 2c, a portion of a display support system 200 is illustrated. The portion display support system 200 includes a chassis 202 having a front surface 202a, a rear surface 202b located opposite the chassis 202 from the front surface 202a, a top edge 202c extending between the front surface 202a and the rear surface 202b, a bottom edge 202d located opposite the chassis 202 from the top edge 202c and extending between the front surface 202a and the rear surface 202b, and a pair of opposing side edges 202e and 202f that extend between the front surface 202a, the rear surface 202b, the top edge 202c, and the bottom edge 202d. In an embodiment, the chassis 202 may be the chassis 116, described above with reference to FIG. 1, and may be part of a portable IHS such as, for example, a tablet computer. In an embodiment, the chassis 202 may be part of a component (e.g., the display 110) of the IHS 100, described above with reference to FIG. 1. A display opening 204 is defined by the front surface 202a and substantially centrally located on the front surface 202a. A support member channel 206 is defined by the chassis 202 and extends into the chassis 202 from the rear surface 202b. A plurality of support surface engagement members 208 are located on each of the top edge 202c, the bottom edge 202d, and the side edges 202e and 202f in a spaced apart relationship from each other and adjacent the corners of the chassis 202. A chassis housing 210 is defined between the front surface 202a, the rear surface 202b, the top edge 202c, the bottom edge 202d, and the side edges 202e and 202f.

An electronic display 212 such as, for example, a Liquid Crystal Display (LCD), is located in the chassis housing 210 and includes a display screen 212a that is located adjacent the display opening 204 and the front surface 202a of the chassis 202. A plurality of other components are located in the chassis housing 210 such as, for example, battery cells 214, a control board 216, and/or a variety of other components known in the art. While one of skill in the art will recognize that, in the illustrated embodiment, the chassis 202 houses components for an external display, they will also recognize that the chassis 202 may house a plurality of different components such as, for example, IHS components, that would provide a portable IHS such as a tablet computer. A hinge support 218a is located between the electronic display 212 and the side edge 202e of the chassis 202, and a hinge support 218b is located between the electronic display 212 and the side edge 202f of the chassis 202. A hinge 220 is moveably coupled to each hinge support 218a and 218b such that each hinge 220 is located between the hinge support 218a and 218b and the electronic display 212. Each hinge is operable to rotate relative to the hinge support 218a and 218b about their coupling. In an embodiment, the hinges 220 are constant torque couplings. Each hinge 220 extends from the chassis 202 and into the support member channel 206, as illustrated in FIG. 2b. One of skill in the art will recognize that the positioning of the hinge supports 218a and 218b and the hinges 220 between the electronic display 212 and the edges 202e and 202f of the chassis 202 may remove the hinge supports 218a and 218b and the hinges 220 from being part of the critical mechanical stack of the system 200 that dictates the thickness (i.e., the largest distance between the front surface 202a and the rear surface 202b of the chassis 202) of the system 200. For example, in the illustrated embodiment, the critical mechanical stack may include the chassis 202, the electronic display 212, and the battery cells 214. One of skill in the art will then recognize that the positioning of the hinge supports 218a and 218b and the hinges 220 allows these components to be substantially co-planar with the electronic display 212 and/or the battery cells 214 and not part of the critical mechanical stack of the system 200.

Figure 3:
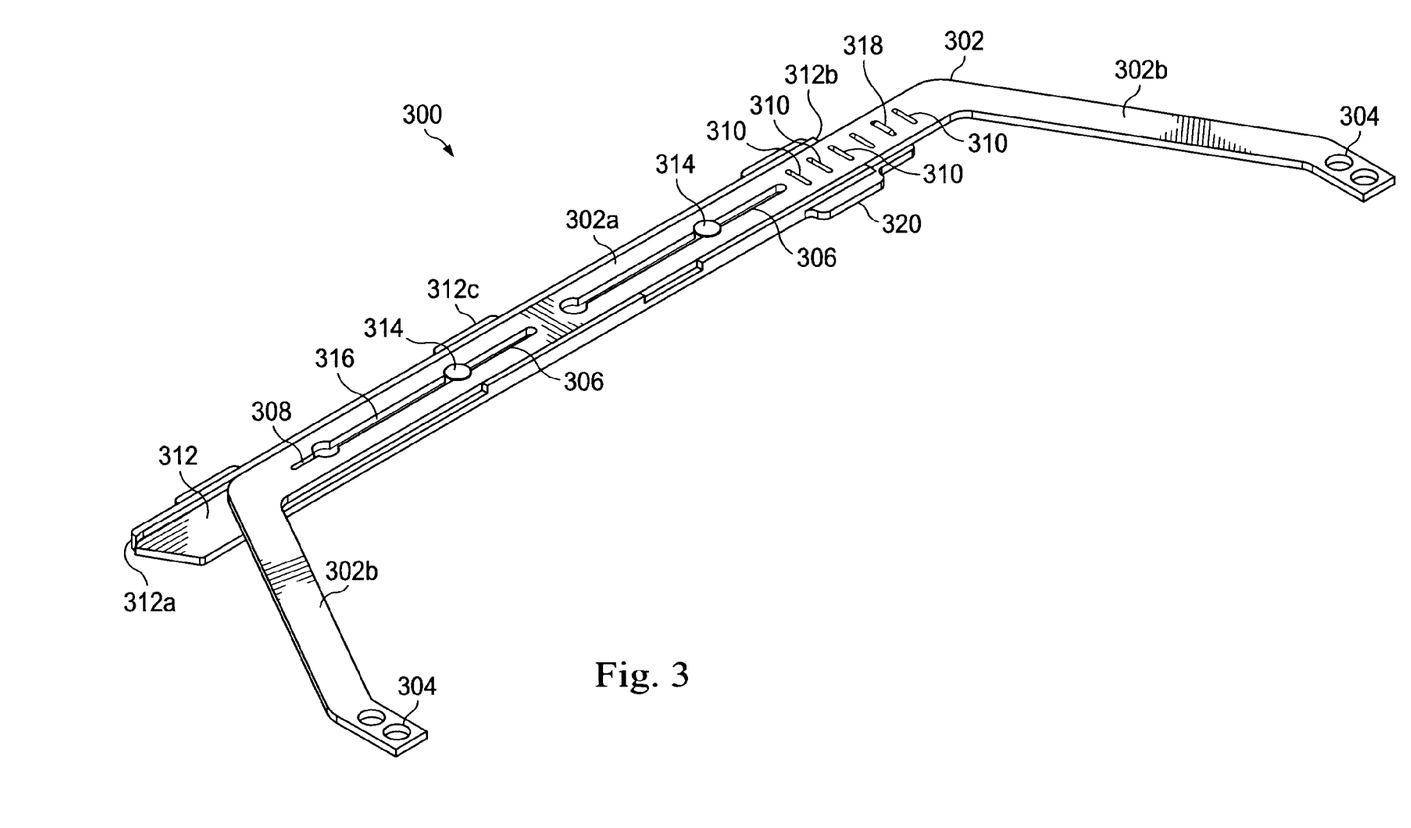
FIG. 3 is a perspective view illustrating an embodiment of a support member and adjustment member used with the display chassis of FIGS. 2a, 2b and 2c.

Referring now to FIG. 3, a portion of a display support system 300 is illustrated. The portion of the display support system 300 includes a support member 302 having a base 302a and a pair of arms 302b extending from opposite ends of the base 302a. Each arm 302b includes a coupling portion 304 that is located on a distal end of the arm 302b that is opposite the portion of the arm 302b adjacent the base 302a. The base 302a defines a plurality of adjustment member coupling features 306 that extend along portions of the length of the base 302a. A stop feature 308 is defined by the base 302a adjacent one of the adjustment member coupling features 306. A plurality of adjustment member locking features 310 are defined by the base 302a and are located along a portion of the length of the base 302a adjacent the adjustment member coupling features 306 and in a spaced apart relationship to each other. An adjustment member 312 may include an elongated member with a pair of distal ends 312a and 312b and a longitudinal edge 312c extending between the distal ends 312a and 312b. The adjustment member 312 is coupled to the support member 302 by a plurality of bosses 314 that extend from the adjustment member 302, through the adjustment member coupling features 306, and are captured in the adjustment member coupling features 306 using methods known in the art. A stop member 316 extends from the adjustment member 312 adjacent one of the bosses 314. A positioning member 318 extends from adjustment member 312 and is operable to be located in one of the adjustment member locking features 310, as illustrated in FIG. 3. A positioning member adjustment tab 320 extends from the adjustment member 312 adjacent the positioning member 318. In operation, movement of the adjustment member 312 relative to the support member 302 may be resisted by the positioning of the positioning member 318 in one of the adjustment member locking features 310, as illustrated. A force may be provided on the positioning member adjustment tab 320 to remove the positioning member 318 from the adjustment member locking features 310 and the adjustment member 312 may be moved relative to the support member 302 along the couplings between the bosses 314 and the adjustment member coupling features 306. Engagement of the stop member 316 and the stop feature 308 prevents the adjustment member 312 from moving relative to the support member 302 beyond a predetermined point.

Figure 4A:
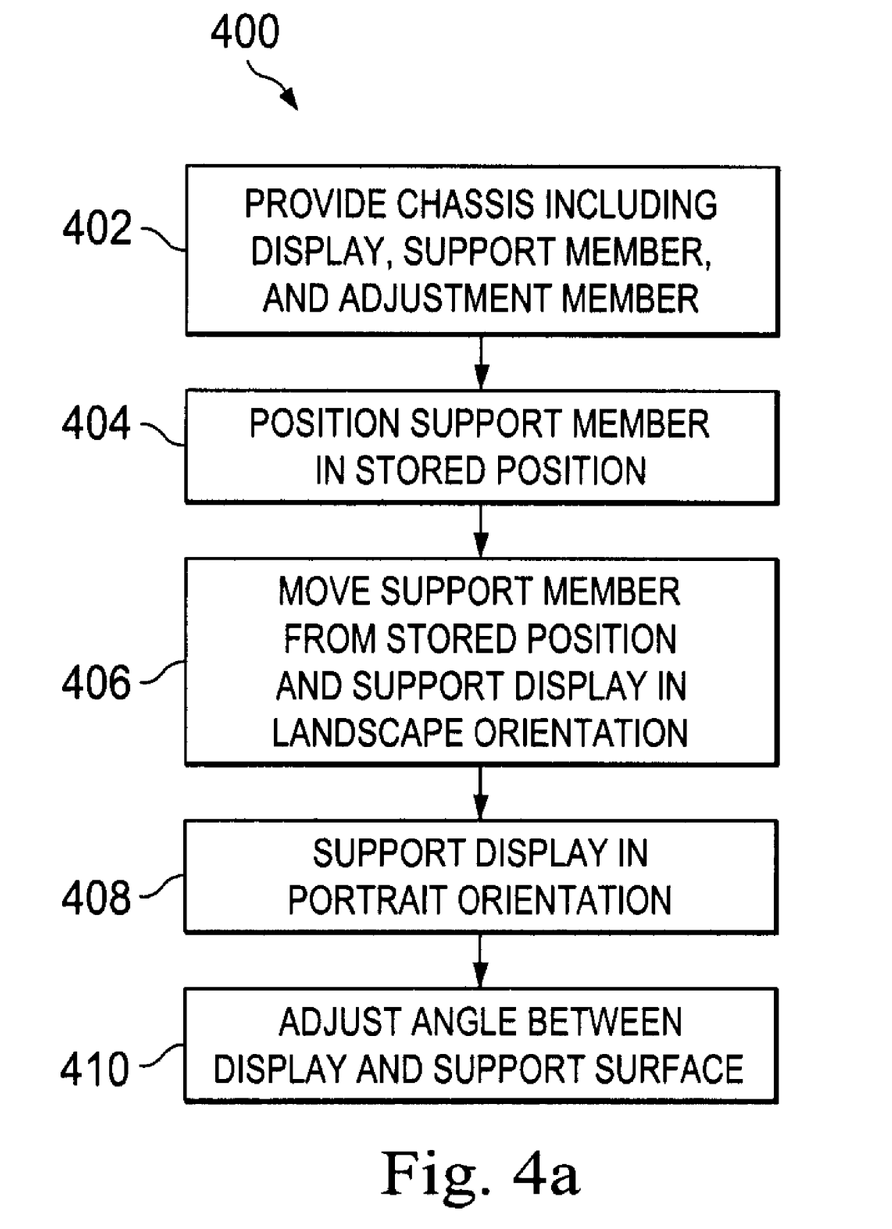
FIG. 4a is a flow chart illustrating an embodiment of a method for supporting a display.
Figure 4B:
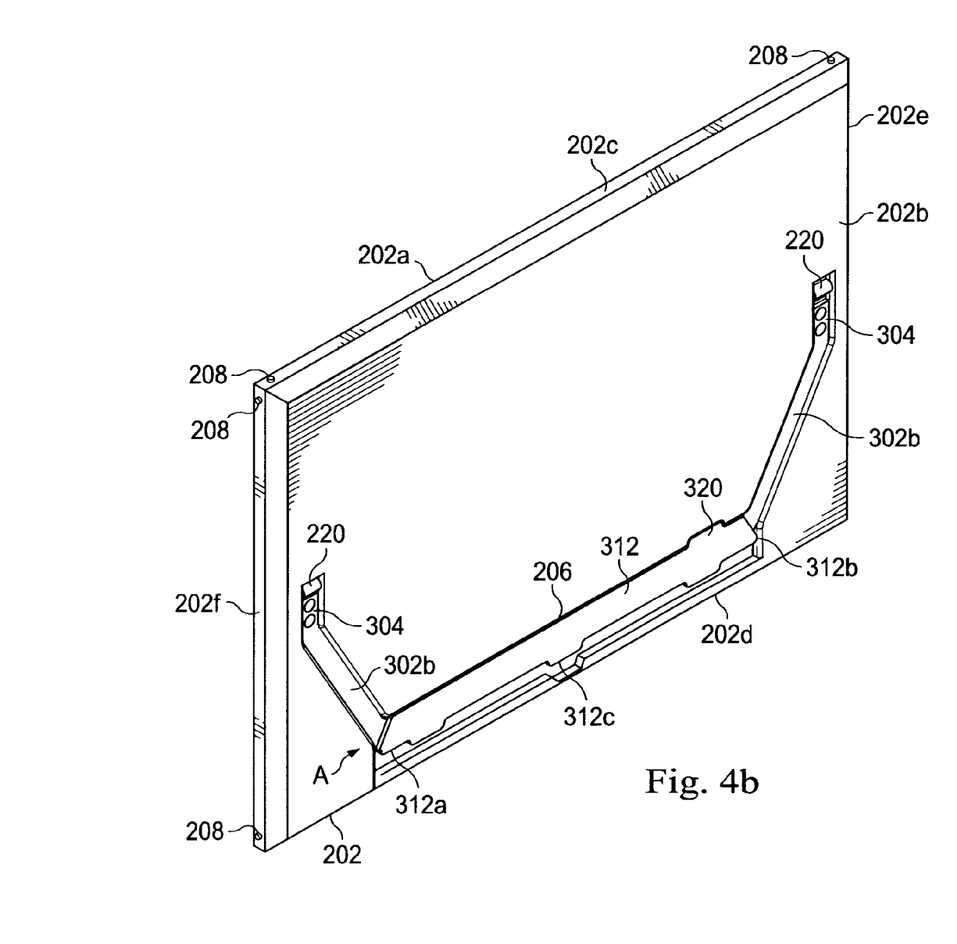
FIG. 4b is a rear perspective view illustrating an embodiment of the support member and adjustment member of FIG. 3 coupled to the chassis of FIGS. 2a, 2b and 2c.
Figure 4C:
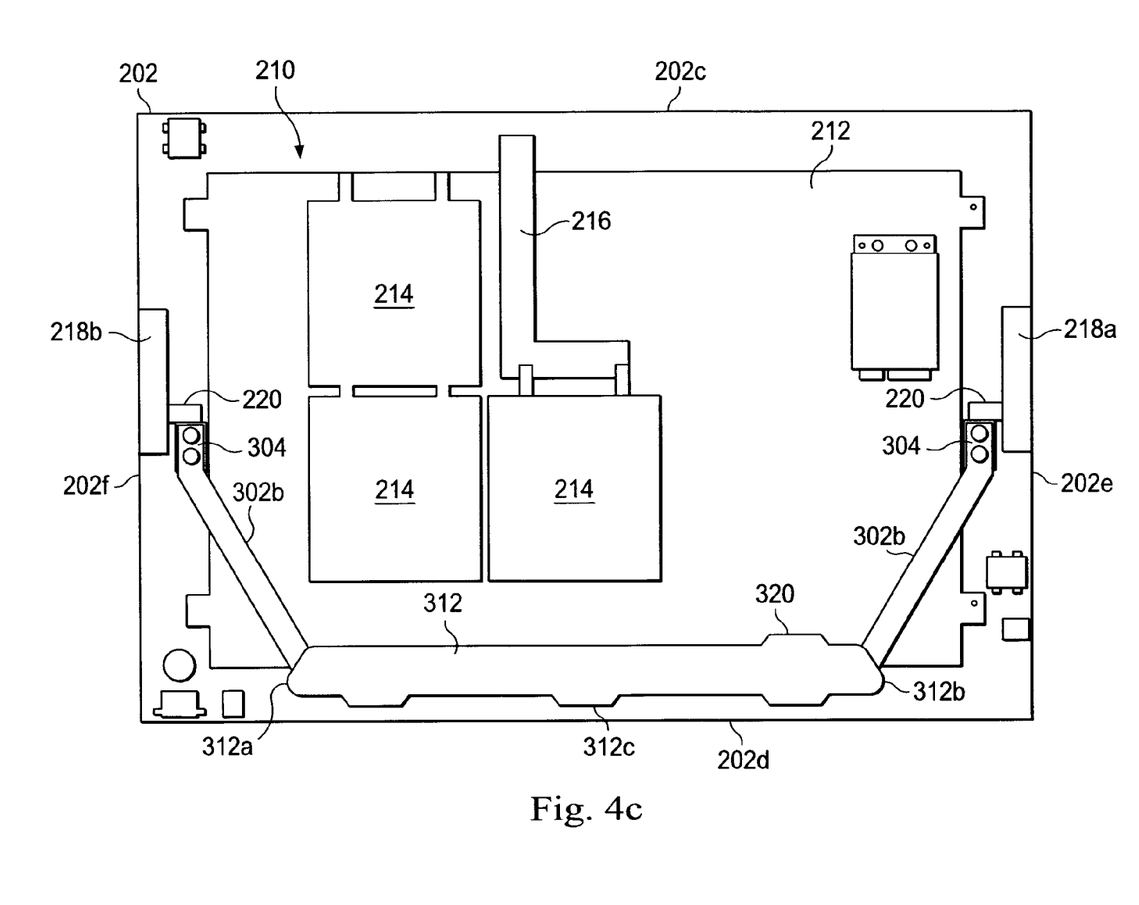
FIG. 4c is a rear view illustrating an embodiment of the support member and adjustment member of FIG. 3 coupled to the chassis of FIG. 2c.

Referring now to FIGS. 4a, 4b and 4c, a method 400 for supporting a display is illustrated. The method 400 begins at block 402 where a chassis including a display, a support member, and an adjustment member is provided and then proceeds to block 404 where the support member is positioned in a stored position. The support member 302 is coupled to the chassis 202 by securing the coupling portions 304 on the support member 302 to the hinges 220 on the chassis 202 using fasteners and/or other methods known in the art, as illustrated in FIG. 4b. Due to the rotational coupling between the hinges 220 and the chassis 202, the support member 302 may then be rotated about the coupling of the hinges 220 and the chassis 202 into a stored position A in which the support member 302 and the adjustment member 312 are positioned in the support member channel 206. In the illustrated embodiment, the support member 302, the adjustment member 312 and the support member channel 206 are sized such that the support member 302 and the adjustment member 312 are either flush with or do not extend past the rear surface 202b of the chassis 202. As one of skill in the art will recognize from FIG. 4c, the positioning of the components that are housed in the chassis 202 (e.g., the battery cells 214 and the control board 216), along with the location of the support member channel 206, allows the support member 302 and the adjustment member 312 to either be flush with, or to not extend past, the rear surface 202b of the chassis 202 without adding to the thickness of the system.

Figure 4D:
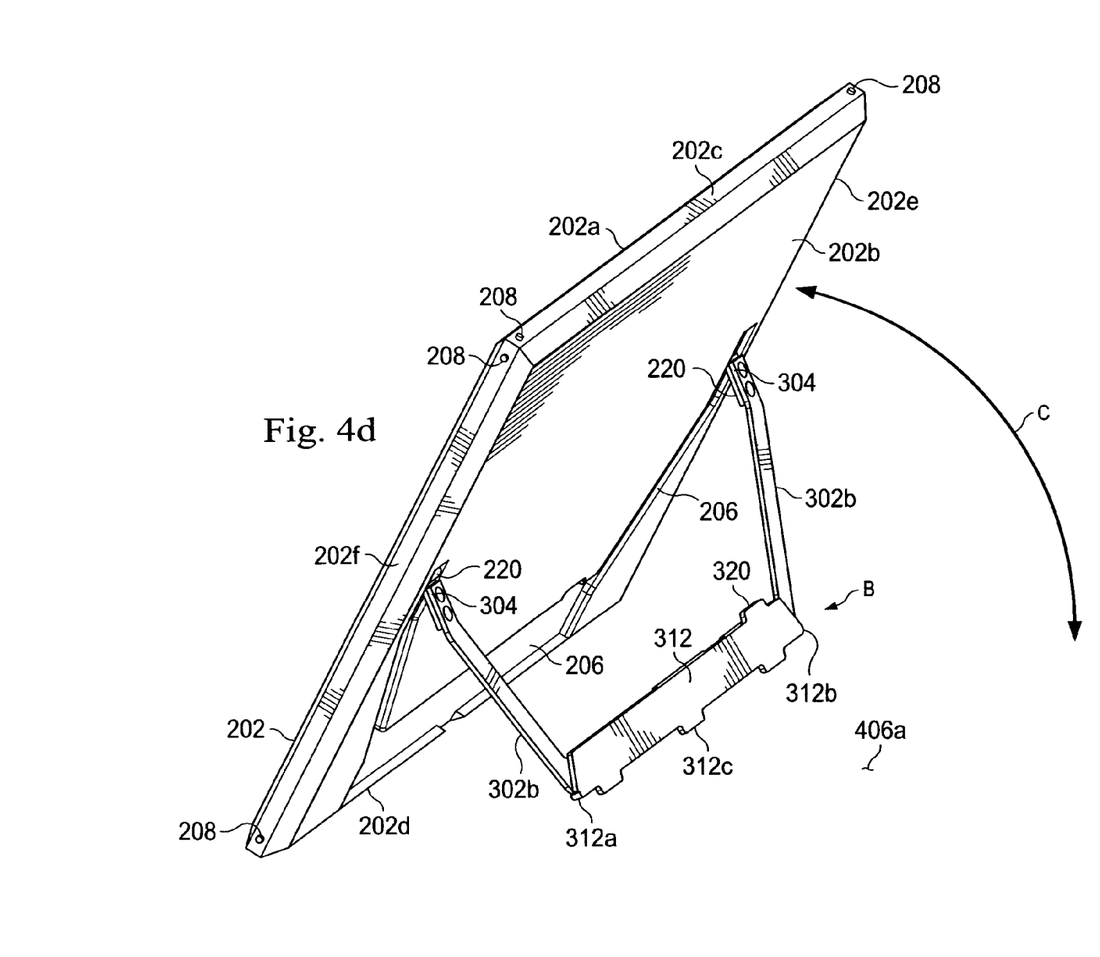
FIG. 4d is a rear perspective view illustrating an embodiment of the support member and display chassis of FIG. 4b with the support member supporting the display chassis in a landscape orientation.
Figure 4E:
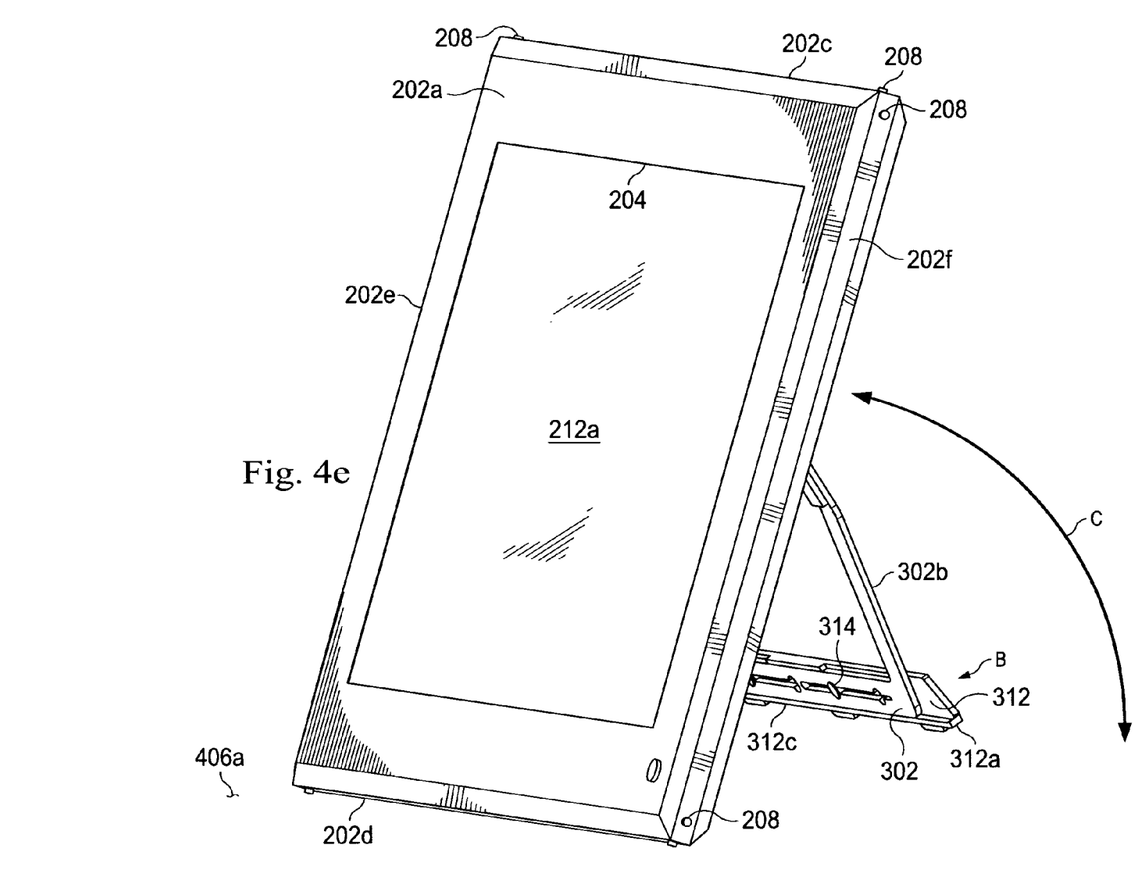
FIG. 4e is a front perspective view illustrating an embodiment of the support member and display chassis of FIG. 4b with the support member supporting the display chassis in a landscape orientation.

Referring now to FIGS. 4a, 4b, 4d and 4e, the method 400 then proceeds to block 406 where the support member is moved from the stored position to support the display in a landscape orientation. The chassis 202 may be positioned on a support surface 406a such that the support surface engagement members 208 located on the bottom edge 202d engage the support surface 406a. The support member 302 is then moved about its coupling to the chassis 202 from the stored position A, illustrated in FIG. 4b, to a support position B, illustrated in FIGS. 4d and 4e, such that the support member 302 extends from the chassis 202 and the longitudinal edge 312c on the adjustment member 312 engages the support surface 406a. With the support surface engagement members 208 on the chassis 202 and the longitudinal edge 312c on the adjustment member 312 engaging the support surface 406a, the electronic display 212a is supported in a landscape orientation, as illustrated in FIGS. 4d and 4e. In an embodiment, the hinges 220 are constant torque couplings that are operable to resist movement of the support member 302 relative to the chassis 202 such that the support member 302 may be positioned relative to the chassis 202 (e.g., in the support position B) and prevented from moving unless a predetermined outside force is applied. In an embodiment, the support member 302 may include a range of motion that, when combined with the appropriately sized constant torque couplings of the hinges 220, allow an angle C between the electronic display 212a and the support surface 406a to be adjusted between approximately 0 and 90 degrees.

Figure 4F:
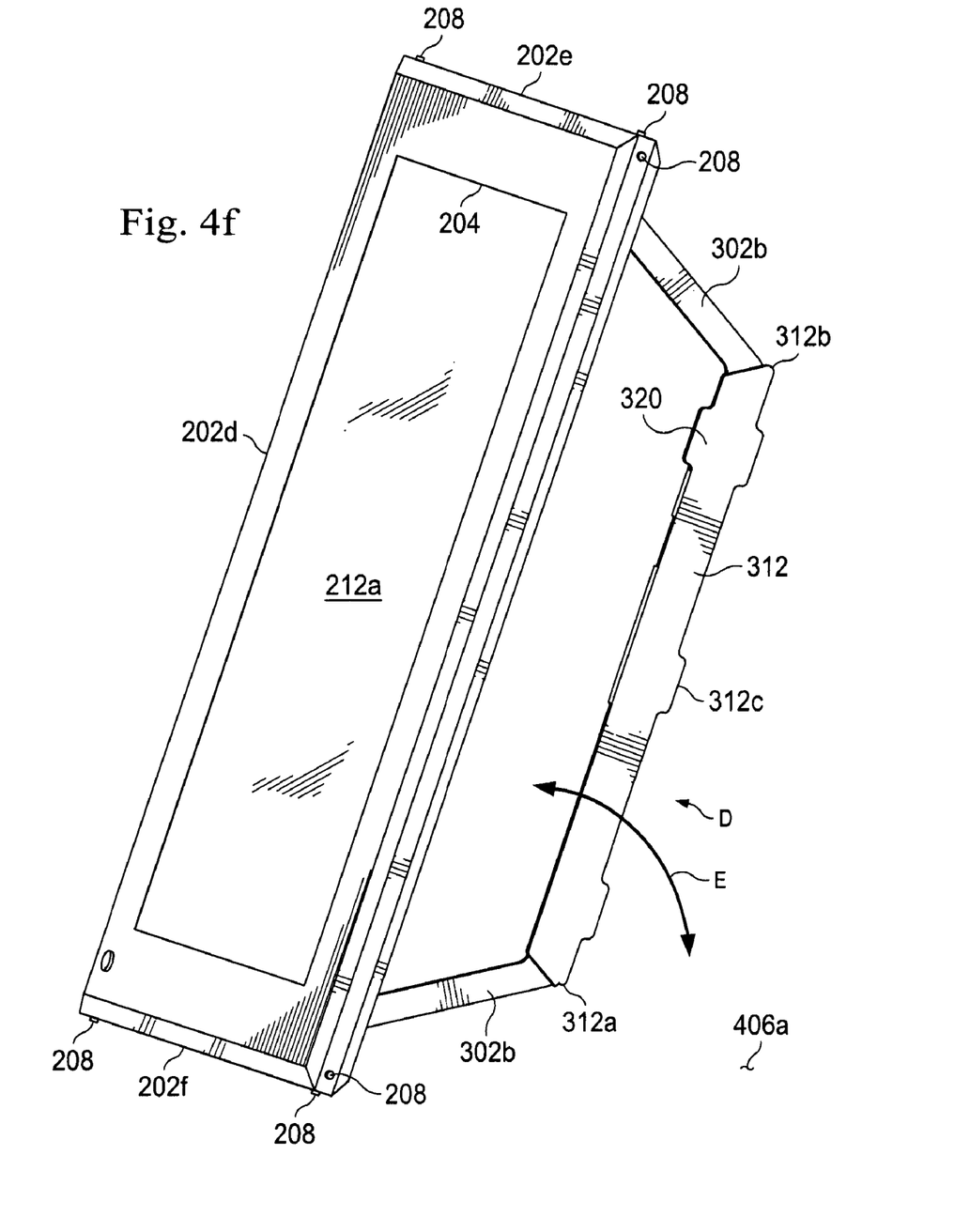
FIG. 4f is a front perspective view illustrating an embodiment of the support member and display chassis of FIG. 4b with the support member supporting the display chassis in a portrait orientation.
Figure 4G:
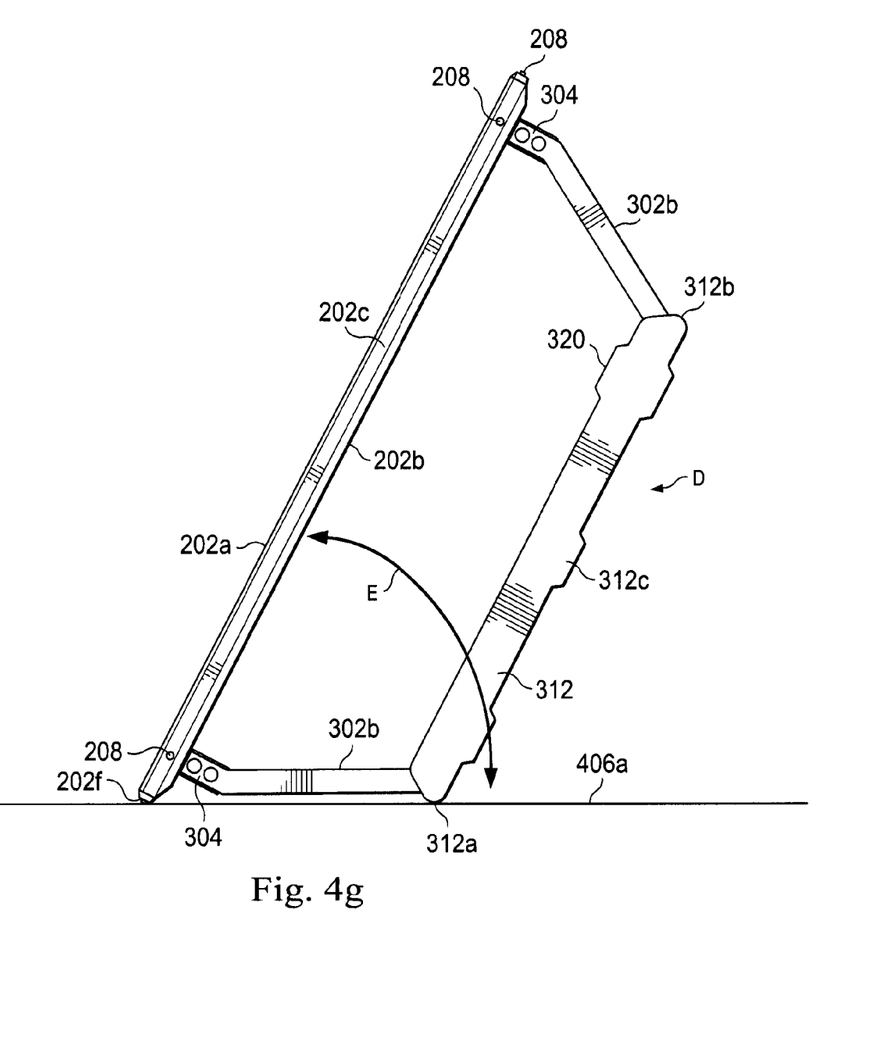
FIG. 4g is a side view illustrating an embodiment of the support member and display chassis of FIG. 4b with the support member supporting the display chassis in a portrait orientation.
Figure 4H:
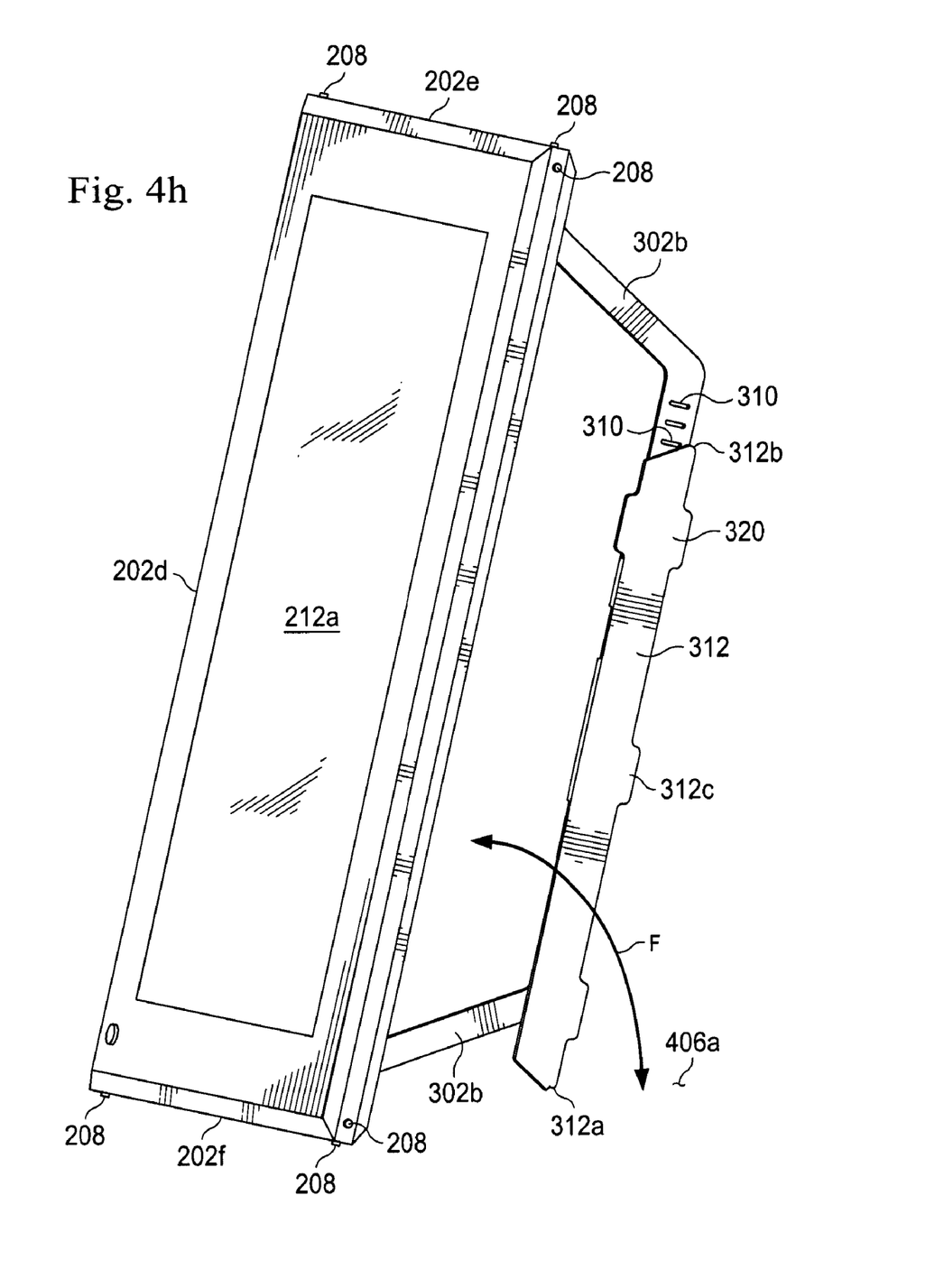
FIG. 4h is a front perspective view illustrating an embodiment of the support member and display chassis of FIG. 4f with the adjustment member moved to adjust the angle of support of the display chassis in a portrait orientation.
Figure 4I:
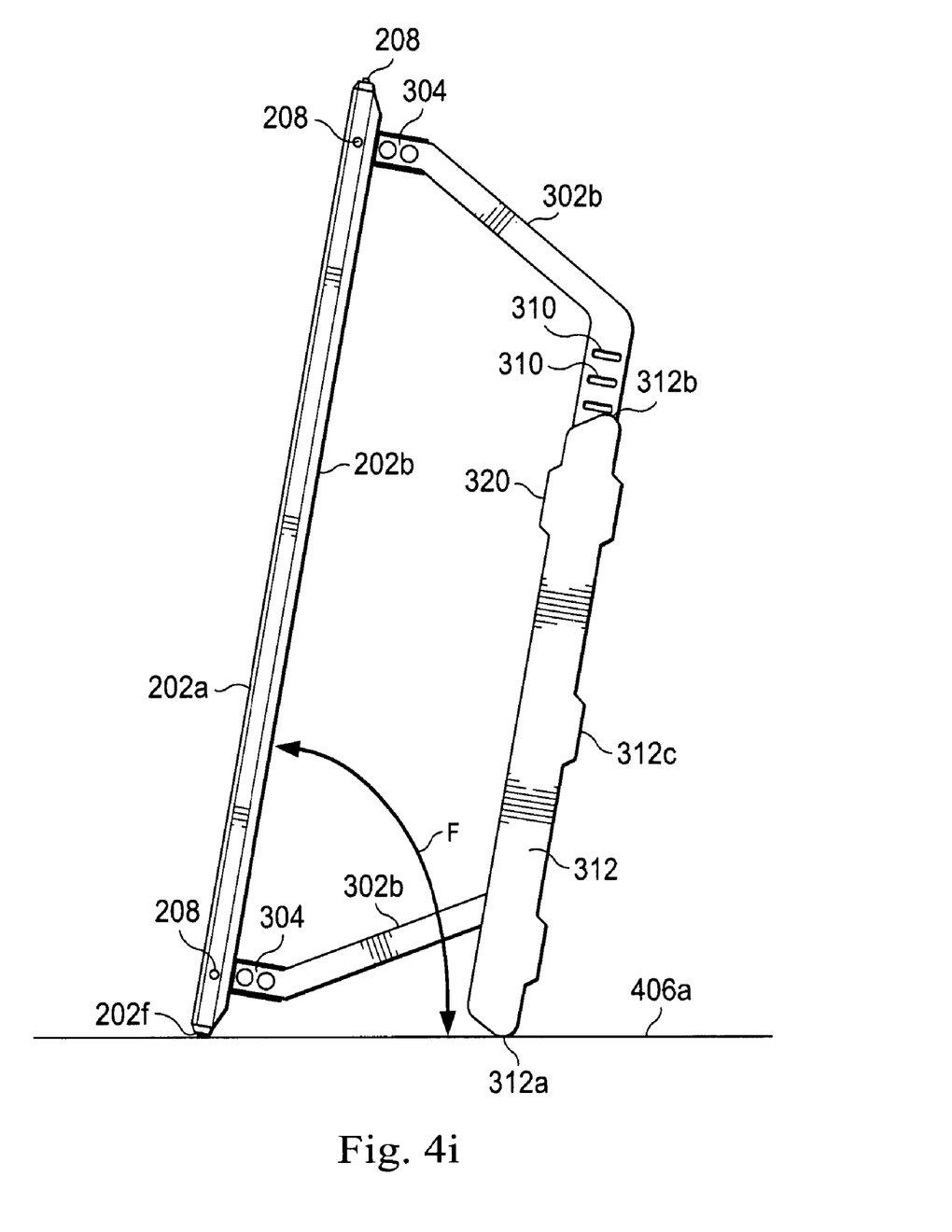
FIG. 4i is a side view illustrating an embodiment of the support member and display chassis of FIG. 4g with the adjustment member moved to adjust the angle of support of the display chassis in a portrait orientation.

Referring now to FIGS. 4a, 4f and 4g, the method 400 then proceeds to block 408 where the display is support in a portrait orientation. The chassis 202 may rotated 90 degrees from the orientation illustrated in FIGS. 4d and 4e such that the support surface engagement members 208 located on the side edge 202f engage the support surface 406a. The support member 302 may be positioned in a support position D that, in the illustrated embodiment, positions the support member 302 at approximately a 90 degree angle to the rear surface 202b of the chassis 202 and results in the distal end 312a of the adjustment member 312 engaging the support surface 406a. With the support surface engagement members 208 on the chassis 202 and the distal end 312a on the adjustment member 312 engaging the support surface 406a, the electronic display 212a is supported in a portrait orientation, as illustrated in FIGS. 4f and 4g, such that the electronic display 212a is oriented at an angle E relative to the support surface 406a. One of skill in the art will recognize that the chassis 202 may be rotated 180 degrees from the orientation illustrated in FIG. 4h, such that the support surface engagement members 208 located on the side edge 202e and the distal end 312b on the adjustment member 312 engage the support surface 406a, without departing from the scope of the present disclosure.

Referring now to FIGS. 3, 4a, 4h and 4i, the method 400 then proceeds to block 410 where an angle between the display and the support surface is adjusted. The adjustment member 312 may be moved relative to the support member 302 by providing a force on the positioning member adjustment tab 320 such that the positioning member 318 is removed from the adjustment member locking feature 310 and the adjustment member 312 is free to move along the length of the base 302a of the support member 302. The adjustment member 312 is then moved to a desired position where the positioning member 318 enters another of the adjustment member locking features 310 such that the adjustment member 312 is again restricted from moving relative to the support member 302. By moving the adjustment member 312 relative to the support member 302 as described above, the electronic display 212a moves from being oriented at the angle E relative to the support surface 406a, illustrated in FIGS. 4f and 4g, to being oriented at an angle F relative to the support surface 406a, illustrated in FIGS. 4h and 4i. In an embodiment, the dimensions of the support member 302 and the adjustment member 312, along with the coupling between the support member 302 and the adjustment member 312, may be chosen to provide a predetermined difference between the angle E and the angle F. Thus, a system and method have been described to support a display that includes components that are captive to the system, do not add thickness to the system, support the system in multiple orientations, and allow the angle of the display being supported to be adjusted in either orientation.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A display support system, comprising:
    a chassis housing an electronic display including a display screen that is located adjacent a first surface of the chassis and faces a first direction, wherein the chassis includes a second surface that is located opposite the chassis from the first surface and faces a second direction that is substantially opposite the first direction, and wherein the chassis defines a support member channel that extends into the second surface;
    a support member moveably coupled to the chassis, wherein the support member is operable to move between a stored position in which the support member is positioned in the support member channel and a support position in which the support member extends from the chassis; and
    an adjustment member moveably coupled to the support member, wherein with the chassis engaging a support surface, the adjustment member is operable to engage the support surface and move relative to the support member such that an angle between the electronic display and the support surface may be adjusted.

2. The system of claim 1, wherein the support member is moveably coupled to the chassis between the electronic display and an edge of the chassis.

3. The system of claim 1, wherein the support member and the adjustment member are located in the support member channel and do not extend past the second surface of the chassis when the support member is in the stored position.

4. The system of claim 1, wherein the adjustment member comprises a longitudinal edge that is operable to engage the support surface to support the electronic display in a landscape orientation, and wherein the adjustment member comprises a distal end that is operable to engage the support surface to support the electronic display in a portrait orientation.

5. The system of claim 1, wherein the chassis includes a plurality of support surface engagement members that are located on an edge of the chassis and that are operable to engage the support surface.

6. The system of claim 1, wherein the moveable coupling between the adjustment member and the support member comprises at least one positioning member that allows the movement of the adjustment member relative to the support member to be resisted in order to set the angle between the electronic display and the support surface.

7. A display support system, comprising:
a chassis housing an electronic display and defining a support member channel;
a support member moveably coupled to the chassis through constant torque couplings that are operable to resist movement of the support member relative to the chassis, wherein the support member is operable to move between a stored position in which the support member is positioned in the support member channel and a support position in which the support member extends from the chassis; and
an adjustment member moveably coupled to the support member, wherein with the chassis engaging a support surface, the adjustment member is operable to engage the support surface and move relative to the support member such that an angle between the electronic display and the support surface may be adjusted.

8. An information handling system, comprising:
a processor;
a memory coupled to the processor;
a chassis housing an electronic display that is coupled to the processor, includes a display screen that is located adjacent a first surface of the chassis, and faces a first direction, wherein the chassis includes a second surface that is located opposite the chassis from the first surface and faces a second direction that is substantially opposite the first direction, and wherein the chassis defines a support member channel that extends into the second surface;
a support member moveably coupled to the chassis, wherein the support member is operable to move between a stored position in which the support member is positioned in the support member channel and a support position in which the support member extends from the chassis; and
an adjustment member moveably coupled to the support member, wherein with the chassis engaging a support surface, the adjustment member is operable to engage the support surface and move relative to the support member such that an angle between the electronic display and the support surface may be adjusted.

9. The system of claim 8, wherein chassis houses the processor and the memory.

10. The system of claim 8, wherein the support member is moveably coupled to the chassis between the electronic display and an edge of the chassis.

11. The system of claim 8, wherein the support member and the adjustment member are located in the support member channel and do not extend past the second surface of the chassis when the support member is in the stored position.

12. The system of claim 8, wherein the adjustment member comprises a longitudinal edge that is operable to engage the support surface to support the electronic display in a landscape orientation, and wherein the adjustment member comprises a distal end that is operable to engage the support surface to support the electronic display in a portrait orientation.

13. The system of claim 8, wherein the chassis includes a plurality of support surface engagement members that are located on an edge of the chassis and that are operable to engage the support surface.

14. The system of claim 8, wherein the moveable coupling between the adjustment member and the support member comprises at least one positioning member that allows the movement of the adjustment member relative to the support member to be resisted in order to set the angle between the electronic display and the support surface.

15. An information handling system, comprising:
a processor;
a memory coupled to the processor;
a chassis defining a support member channel and housing an electronic display that is coupled to the processor;
a support member moveably coupled to the chassis through constant torque couplings that are operable to resist movement of the support member relative to the chassis, wherein the support member is operable to move between a stored position in which the support member is positioned in the support member channel and a support position in which the support member extends from the chassis; and
an adjustment member moveably coupled to the support member, wherein with the chassis engaging a support surface, the adjustment member is operable to engage the support surface and move relative to the support member such that an angle between the electronic display and the support surface may be adjusted.

16. A method for supporting a display, comprising:
providing a chassis that houses an electronic display including a display screen that is located adjacent a first surface of the chassis and faces a first direction, wherein the chassis includes a second surface that is located opposite the chassis from the first surface and faces a second direction that is substantially opposite the first direction, and wherein the chassis defines a support member channel that extends into the second surface, and wherein a support member is moveably coupled to the chassis and an adjustment member is moveably coupled to the support member;
positioning the support member in a stored position such that the support member is located in the support member channel;
supporting the electronic display in a landscape orientation by engaging a support surface with a first edge of the chassis and moving the support member relative to the chassis such that a longitudinal edge of the adjustment member engages the support surface;

supporting the electronic display in a portrait orientation by engaging the support surface with a second edge of the chassis and engaging a distal end of the adjustment member with the support surface; and adjusting an angle between the electronic display and the support surface by moving the adjustment member relative to the support member.

17. The method of claim 16, wherein the support member and the adjustment member are located in the support member channel and do not extend past the second surface of the chassis when the support member is positioned in the stored position.

18. A method for supporting a display, comprising:

providing a chassis that defines a support member channel and houses an electronic display, wherein a support member is moveably coupled to the chassis and an adjustment member is moveably coupled to the support member;

positioning the support member in a stored position such that the support member is located in the support member channel;

supporting the electronic display in a landscape orientation by engaging a support surface with a first edge of the chassis and moving the support member relative to the chassis such that a longitudinal edge of the adjustment member engages the support surface;

supporting the electronic display in a portrait orientation by engaging the support surface with a second edge of the chassis and engaging a distal end of the adjustment member with the support surface restricting the movement of the adjustment member relative to the support member in order to set the angle between the electronic display and the support surface; and adjusting an angle between the electronic display and the support surface by moving the adjustment member relative to the support member.

* * * * *